(12) United States Patent (10) Patent No.: US 9,083,162 B2
Adachi et al. (45) Date of Patent: Jul. 14, 2015

(54) WIRING HARNESS

(75) Inventors: Hideomi Adachi, Kosai (JP); Hidehiko Kuboshima, Kosai (JP)

(73) Assignee: Yazaki Corporation, Tokyo (JP)

( * ) Notice: Subject to any disclaimer, the term of this patent is extended or adjusted under 35 U.S.C. 154(b) by 270 days.

(21) Appl. No.: 13/634,413

(22) PCT Filed: Feb. 2, 2011

(86) PCT No.: PCT/JP2011/052131
§ 371 (c)(1),
(2), (4) Date: Sep. 12, 2012

(87) PCT Pub. No.: WO2011/129137
PCT Pub. Date: Oct. 20, 2011

(65) Prior Publication Data
US 2013/0026826 A1    Jan. 31, 2013

(30) Foreign Application Priority Data
Apr. 15, 2010   (JP) .................................. 2010-093608

(51) Int. Cl.
*B60L 1/00* (2006.01)
*H02G 3/04* (2006.01)
*B60R 16/02* (2006.01)
*H05K 9/00* (2006.01)

(52) U.S. Cl.
CPC .......... *H02G 3/0487* (2013.01); *B60R 16/0207* (2013.01); *H05K 9/0098* (2013.01)

(58) Field of Classification Search
USPC .......................... 307/9.1; 180/65.1, 65.2, 271
See application file for complete search history.

(56) References Cited

U.S. PATENT DOCUMENTS

| 6,460,642 B1* | 10/2002 | Hirano ........................ 180/65.1 |
| 2005/0011687 A1* | 1/2005 | Yamaguchi et al. ......... 180/65.1 |
| 2005/0162015 A1 | 7/2005 | Yamaguchi et al. |
| 2008/0173478 A1 | 7/2008 | Kogure et al. |

FOREIGN PATENT DOCUMENTS

| CN | 1667898 A | 9/2005 |
| JP | 2000-152470 A | 5/2000 |
| JP | 2004-224156 A | 8/2004 |
| JP | 2005-218189 A | 8/2005 |
| JP | 2008-253017 A | 10/2008 |

OTHER PUBLICATIONS

Chinese Office Action dated Dec. 1, 2014 issued for corresponding Chinese Patent Application No. 201180018978.5.

(Continued)

*Primary Examiner* — Rexford Barnie
*Assistant Examiner* — Xuan Ly
(74) *Attorney, Agent, or Firm* — Locke Lord LLP

(57) ABSTRACT

There is provided a wiring harness allowing a cable main body to be shaken effectively. The wiring harness includes a harness main body 5 having a plurality of high-voltage electric wires 4. A middle portion 5a of the harness main body 5 includes a shake tolerance range R1 as a range of allowing the high-voltage electric wires 4 to be shaken. This shake tolerance range R1 is composed of an individual wire shake range R3 and a wire bundle shake range R4. In the individual wire shake range R3, the high-voltage electric wires 4 are routed so as to be allowed to be individually shaken.

6 Claims, 4 Drawing Sheets

(56) References Cited

OTHER PUBLICATIONS

International Search Report dated Apr. 26, 2011, issued for PCT/JP2011/052131.

* cited by examiner (d)

WIRING HARNESS

TECHNICAL FIELD

This invention relates to a wiring harness including a plurality of high voltage electric wires.

BACKGROUND ART

An electric vehicle and a hybrid vehicle include: a motor as a power source; an inverter configured to generate three-phase alternating current necessary for driving the motor; and a wiring harness connecting the motor with the inverter.

A wiring harness disclosed in PTL 1 below is a so-called motor cable device. This motor cable device includes: a harness main body having a plurality of high voltage electric wires; a motor-side connecting portion disposed at one end of the harness main body for connecting the motor; and an inverter-side connecting portion disposed at the other end of the harness main body for connecting the inverter; and a harness fixture interposed at a middle portion of the harness main body for fixing the middle portion to a vehicle body.

The harness fixture is fixed to a vehicle body using a dedicated mount and a fixing bracket. The harness fixture, the dedicated mount, and the fixing bracket are fixed portions with respect to a vehicle body to prevent the harness main body from shaking caused by a vibration or a shack generated in a vehicle.

CITATION LIST

Patent Literature

[PTL 1]
JP, A, 2008-253017

SUMMARY OF INVENTION

Technical Problem

In the conventional art described above, there is a following problem. Namely, because the motor is both a power source and a vibration generating source, a generated vibration is propagated to the fixed portions via the harness main body. When the fixed portion is structurally in a loose state, there is a problem that a noise may be generated at the fixed portions, or the fixed portions may be damaged.

Therefore, the inventor of the present invention conceives an idea of solving the above problem by positively propagating the vibration and the shock generated in a vehicle to a cable main body, and thereby shaking the cable main body, and absorbing the vibration and the shock due to the shaking.

In view of the above circumstances, an object of the present invention is to provide a wiring harness allowing a cable main body to be shaken effectively.

Solution to Problem

For attaining the object, according to the invention claimed in claim 1, there is provided an on-vehicle wiring harness comprising:
a harness main body having a plurality of high-voltage electric wires,
wherein a middle portion of the harness main body includes a range of allowing the high-voltage electric wires to be shaken, and
wherein in a part or all of the range, the high-voltage electric wires are routed so as to be allowed to be shaken individually.

According to the present invention having such a feature, an external vibration and an external shock (for example, a vibration from a motor or a vibration and a shock generated in a vehicle) are positively propagated to the plurality of high-voltage electric wires in the middle portion of the harness main body to shake the high-voltage electric wires, and due to this shaking, the vibration or the like can be absorbed. Although the high-voltage electric wires are relatively firm, by routing the high-voltage electric wires to allowing them to be shaken individually, the vibration or the like can be effectively absorbed.

According to the invention claimed in claim 2, there is provided the wiring harness as claimed in claim 1, wherein a plurality of shielded electric wires are used as the high-voltage electric wires.

According to the present invention having such a feature, the harness main body includes a plurality of shielded electric wires. Because the shielded electric wire includes a shield member in a configuration of the shielded electric wire, an electric shield effect can be achieved with a few members in the wiring harness.

According to the invention claimed in claim 3, there is provided the wiring harness as claimed in claim 1, wherein a plurality of non-shielded electric wires are used as the high-voltage electric wires, and
wherein the harness main body includes a shield member for covering the non-shielded electric wires in a lump.

According to the present invention having such a feature, by using the non-shielded electric wire, a configuration of the electric wire can be simplified. The harness main body in the present invention includes: a plurality of non-shielded electric wires; and a shield member covering them in a lump.

According to the invention claimed in claim 4, there is provided the wiring harness as claimed in any one of claims 1 to 3,
wherein the harness main body includes a protect member covering the plurality of high-voltage electric wires while allowing the high-voltage electric wires to be shaken individually.

According to the present invention having such a feature, in the range of allowing the high-voltage electric wires to be shaken individually, the protect member covers the high-voltage electric wires in a loose state. The protect member exerts a protective function so as not to affect the individual shaking.

Advantageous Effects of Invention

According to the invention claimed in claim 1, the external vibration or the external shock is propagated positively to the middle portion of the harness main body. Further, a plurality of high-voltage electric wires is allowed to be shaken individually. Therefore, the vibration or the like can be absorbed effectively. Thereby, the noise, the damage or the like can be prevented from generating. According to the present invention, there is provided a wiring harness allowing a cable main body to be shaken effectively.

According to the respective inventions claimed in claims 2 and 3, there is provided a good embodiment as the harness main body.

According to the invention claimed in claim 4, the protect member protects a plurality of high-voltage electric wires.

DESCRIPTION OF EMBODIMENTS

A wiring harness includes a harness main body having a plurality of high-voltage electric wires. A middle portion of the harness main body includes a range of allowing the high-voltage electric wires to be shaken. In this range, the high-voltage electric wires are routed so as to be allowed to be shaken individually.

Embodiment

Figure 2A:
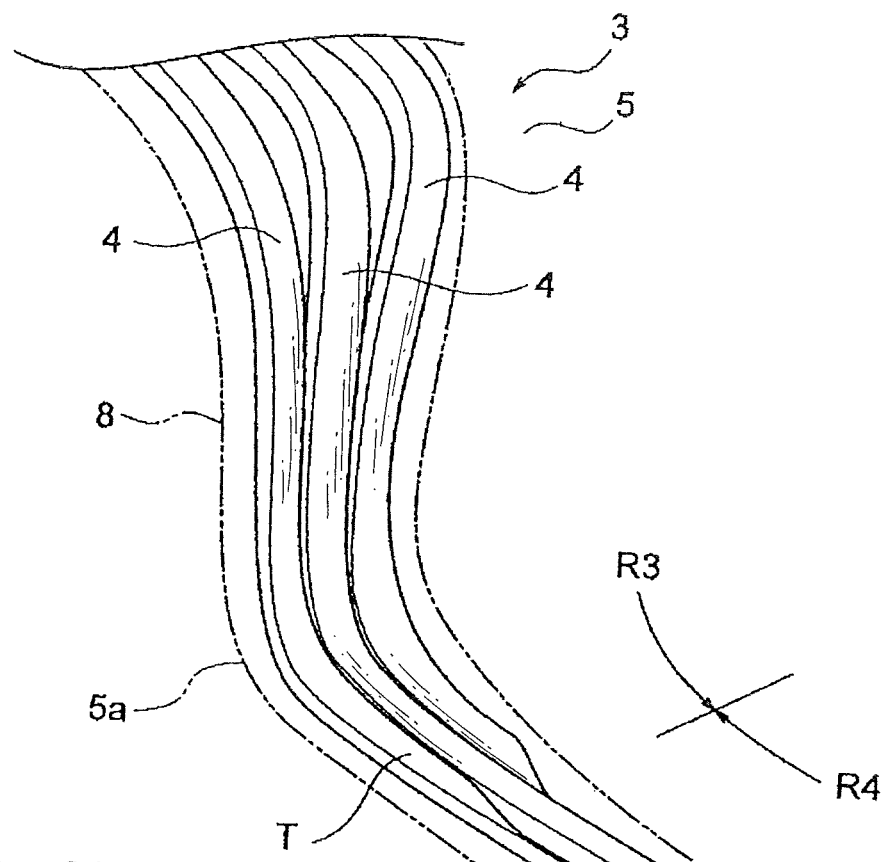
FIG. 2A is a perspective view showing an overlapped state of high-voltage electric wires in a range of allowing the electric wires to be shaken in a bundle.
Figure 2B:
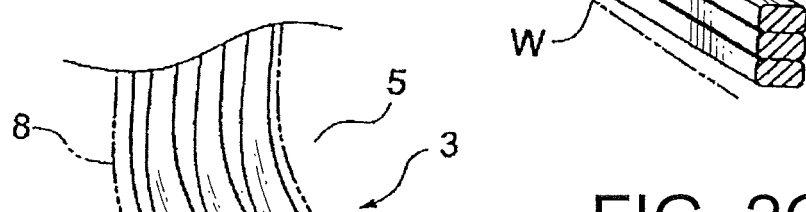
FIG. 2B is a perspective view showing an aligned state of the high-voltage electric wires in the range of allowing the electric wires to be shaken in a bundle.
Figure 2C:
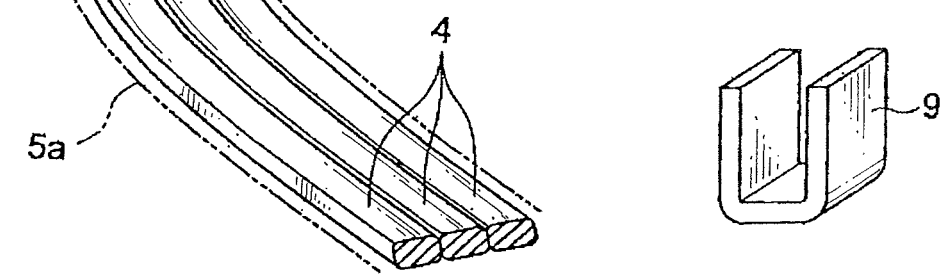
FIG. 2C is a perspective view showing an alignment and holding member.
Figure 3A:
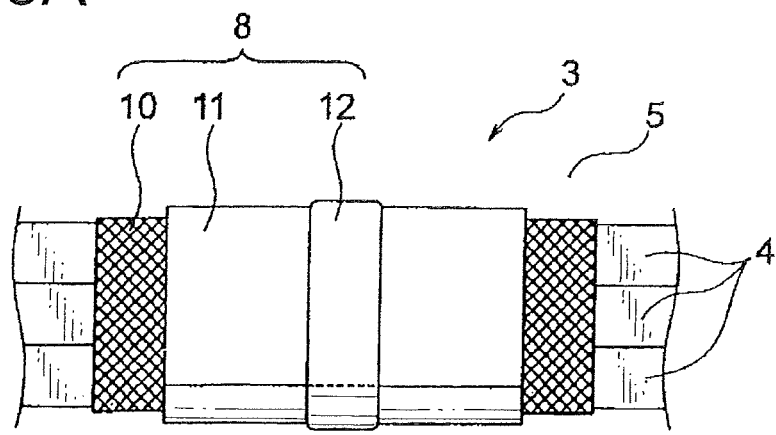
FIG. 3A is a configuration view showing the harness main body including an exterior member and a braided wire as a protective member.
Figure 3B:
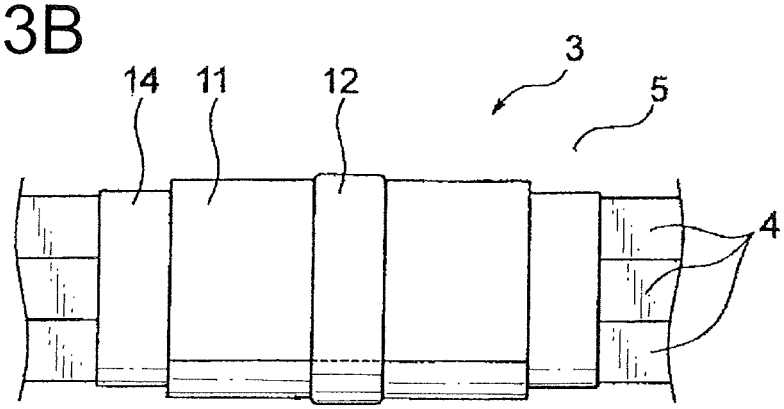
FIG. 3B is a configuration view showing the harness main body including an exterior member and a metallic foil as the protective member.
Figure 3C:
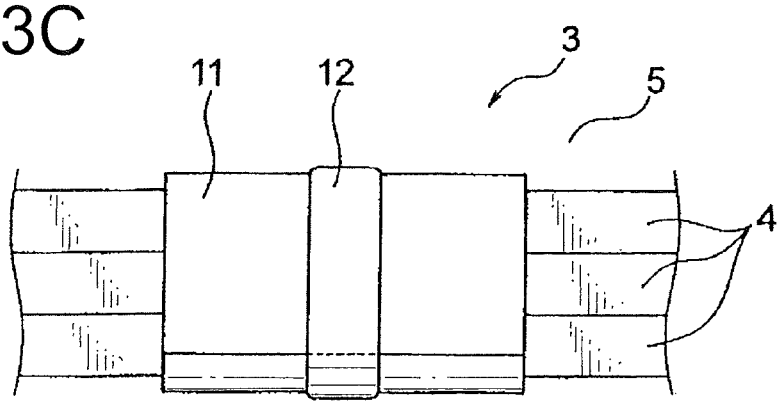
FIG. 3C is a configuration view showing the harness main body including an exterior member as the protective member, and showing a shielded electric wire as the high-voltage electric wire.
Figure 4A:
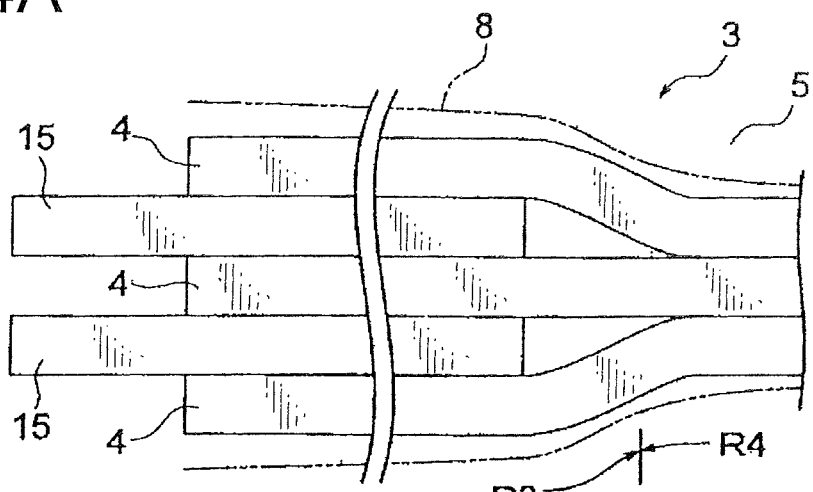
FIG. 4A is a schematic view showing a first process of a wiring harness production.
Figure 4B:
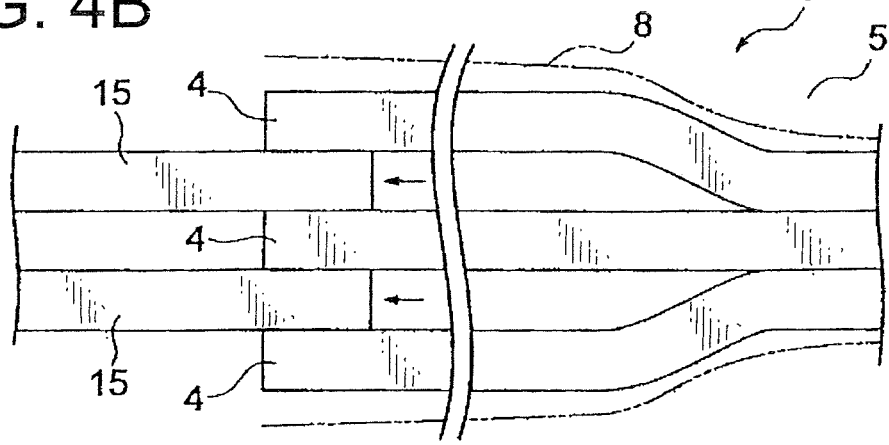
FIG. 4B is a schematic view showing a second process of the wiring harness production.
Figure 4C:
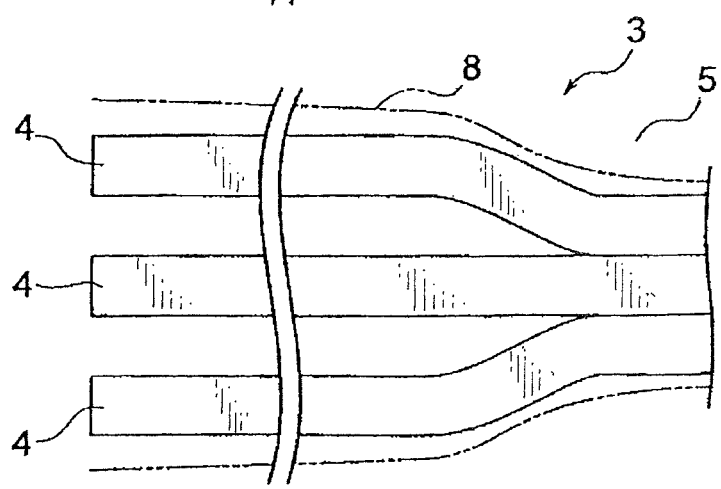
FIG. 4C is a schematic view showing a third process of a wiring harness production.

Hereinafter, an embodiment will be explained with reference to figures. FIGS. 1A to 1E show a wiring harness according to the present invention. Further, FIGS. 2A to 2C show a state of high-voltage electric wires, FIGS. 3A to 3C show a configuration of the harness main body, and FIGS. 4A to 4C show a production process of the wiring harness.

The wiring harness of this embodiment is directed to, but not limited to, a wiring harness routed in a hybrid vehicle or an electric vehicle. Specifically, the wiring harness is directed to a high-voltage wiring harness routed so as to connect a motor and an inverter, a wiring harness routed so as to connect the inverter and a battery, or a wiring harness routed so as to connect devices (for example, electric junction box). Hereinafter, the wiring harness connecting the motor and the inverter will be explained with examples.

In FIGS. 1A to 1E, a motor 1 and an inverter 2 in an electric vehicle or a hybrid vehicle are electrically connected to each other with a wiring harness 3 (also referred to as motor cable). The wiring harness 3 includes: a harness main body 5 having a plurality of high-voltage electric wires 4; a motor-side connecting portion 6 provided at one end of the harness main body 5; and an inverter-side connecting portion 7 provided at the other end of the harness main body 5.

Figure 1A:
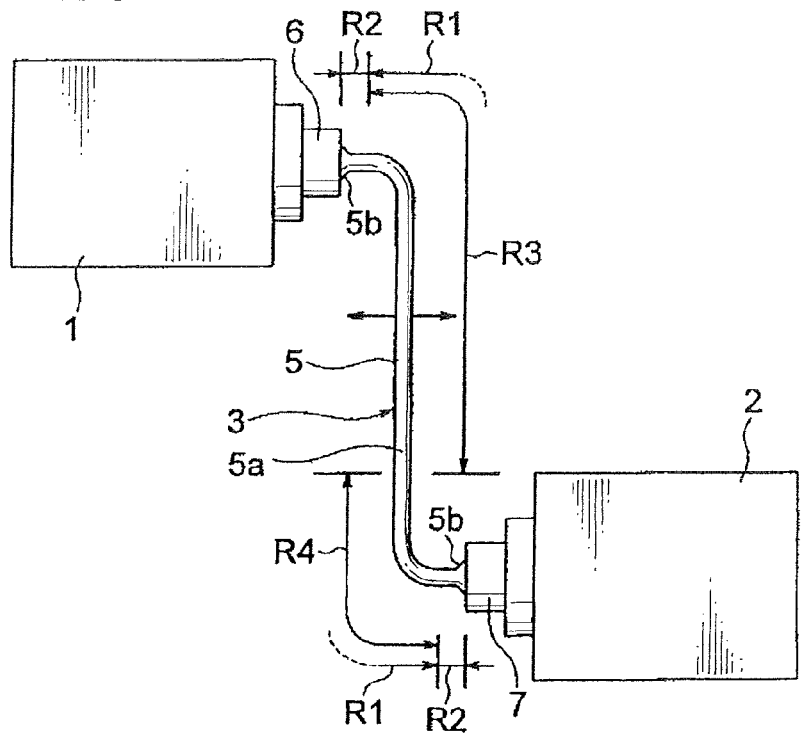
FIG. 1A is a schematic view showing a used state of a wiring harness according to the present invention.
Figure 1B:
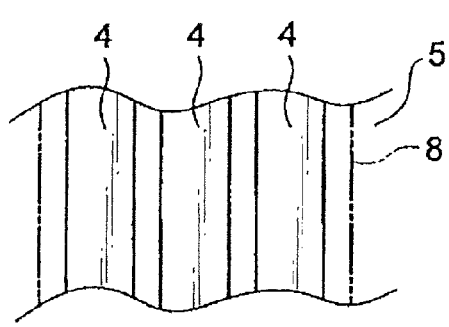
FIG. 1B is a schematic view showing a harness main body in a range of allowing electric wires to be shaken individually.
Figure 1C:
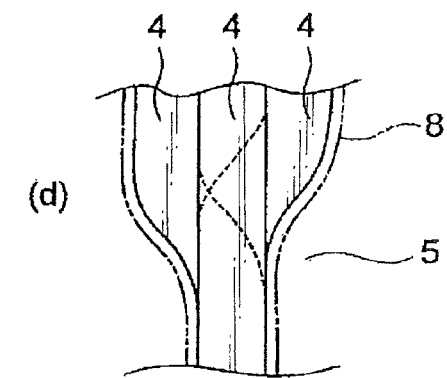
FIG. 1C is a sectional view of FIG. 1B.
Figure 1D:
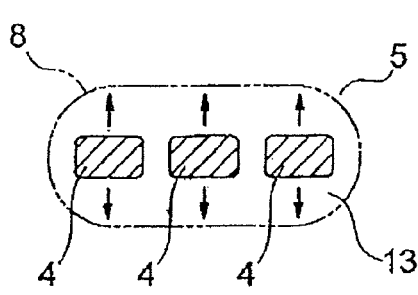
FIG. 1D is a schematic view showing the harness main body in a range of allowing the electric wires to be shaken in a bundle.
Figure 1E:
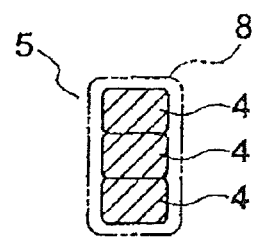
FIG. 1E is a sectional view of FIG. 1D.

The wiring harness 3 positively propagates a vibration from the motor 1 and a shock from a vehicle to a specific range of the high-voltage electric wires 4 in the harness main body 5, thereby the high-voltage electric wires 4 are shaken in an arrow direction of FIG. 1A. Further, the vibration or the like is absorbed by this shaking. The wiring harness 3 includes such a vibration absorbing structure. Hereinafter, components of the wiring harness 3 will be explained.

In FIGS. 1A to 1E and 2A to 2C, the harness main body 5 includes: a plurality of high-voltage electric wires 4; and a protective member 8 covering them in a lump. The high-voltage electric wires 4 include a shake tolerance range R1 in which the vibration or the shock from the motor 1 is positively propagated to shake the high-voltage electric wires 4. The shake tolerance range R1 is set as a range of allowing the high-voltage electric wires 4 to be shaken in a middle portion of the harness main body 5. In this embodiment, whole middle portion 5a of the harness main body 5 corresponds to the shake tolerance range R1. Namely, in this embodiment, a range other than both end portions 5b of the harness main body 5 is set as the shake tolerance range R1. Incidentally, when a fixed point (for example, the harness fixture in PTL 1) is provided at the middle portion 5a of the harness main body 5, the shake tolerance range R1 is set at a vibration generating side of the fixed point. Namely, the shake tolerance range R1 is a range where the fixed point is not provided.

In this embodiment, both sides of the shake tolerance range R1 is set as a terminal forming range R2 corresponding to a forming range of the end portion 5b. Further, the shake tolerance range R1 is composed of an individual wire shake range R3 and a wire bundle shake range R4 (The shake tolerance range R1 may be composed solely of the individual wire shake range R3). The individual wire shake range R3 and the wire bundle shake range R4 are continued to each other. The individual wire shake range R3 is disposed at the vibration generating side. Details of the individual wire shake range R3 and the wire bundle shake range R4 will be described later.

The high-voltage electric wires 4 are high-voltage cables and three high-voltage electric wires 4 are used in this embodiment. Three high-voltage electric wires 4 are the same. The high-voltage electric wire 4 is composed of a conductor portion, and a cover portion covering the conductor portion. The conductor portion is, for example, a stranded wire made of copper or aluminum. Alternatively, the conductor portion is a rectangular conductor or a circular conductor made of copper or aluminum. Incidentally, in figures, the high-voltage electric wire 4 includes the rectangular conductor (as one example). The high-voltage electric wire 4 in this embodiment is a non-shielded wire (configuration of a shielded wire will be described later.)

A length of the high-voltage electric wire 4 is a sum of a length corresponding to a distance between the motor 1 and the inverter 2, and a length needed to a shake in an arrow direction of FIG. 1. Namely, in this embodiment, the length of the high-voltage electric wire 4 is at least a length corresponding to the shake tolerance range R1 and the terminal forming range R2.

In the individual wire shake range R3 in the shake tolerance range R1, the high-voltage electric wires 4 are routed in a manner that the high-voltage electric wires 4 can be individually shaken. As a concrete example, the high-voltage electric wires 4 are routed in a manner that the high-voltage electric wires 4 are not closely abutted on each other so that the high-voltage electric wires 4 adjacent to each other can be individually shaken with a specific gap. Incidentally, as long as the high-voltage electric wires 4 can be individually shaken, to provide the specific gap is optional.

In the wire bundle shake range R4 in the shake tolerance range R1, the high-voltage electric wires 4 are routed in a manner that the high-voltage electric wires 4 are abutted on each other. More specifically, around a boundary between the individual wire shake range R3 and the wire bundle shake range R4, a gap between the high-voltage electric wires 4 that can be individually shaken is gradually narrower, thereby the high-voltage electric wires 4 become abutted on each other. The manner that the high-voltage electric wires 4 are abutted on each other is realized by overlapping the high-voltage electric wires 4 with each other as shown in FIG. 2A, or by arranging the high-voltage electric wires 4 in a line as shown in FIG. 2B. When the high-voltage electric wires 4 are abutted on each other, the harness main body 5 becomes slim and the routing flexibility is increased. When the high-voltage electric wires 4 abutted on each other, the high-voltage electric wires 4 are in a bundle shape.

In a boundary between the individual wire shake range R3 and the wire bundle shake range R4 denoted by a reference sign T, total length of the high-voltage electric wires 4 in a height direction is reduced. Further, in an overlapping portion denoted by a reference sign W, total width of the high-voltage electric wires 4 is reduced.

Incidentally, for maintaining a condition that the high-voltage electric wires 4 are abutted on each other, an ordered state maintaining member 9 shown in FIG. 2C can be used. The ordered state maintaining member 9 is, for example, made of resin, and formed in substantially U-shape. When the high-voltage electric wires 4 are inserted into the ordered state maintaining member 9, the ordered state maintaining member 9 holds the high-voltage electric wires 4 while maintaining the abutted state or the ordered state.

In FIGS. 1B to 1E, 2A to 2B, and 3A, the protective member 8 covers the high-voltage electric wires 4 in a lump, and exerts a wire protecting function and an electromagnetic shielding function because the high-voltage electric wires 4 are non-shielded wires in this embodiment.

A configuration of the protective member 8 will be specifically explained with reference to FIG. 3A. The protective member 8 includes: a braided wire. 10 as a shielding member; an exterior member 11 disposed outside of the braided wire 10; and a wound tape 12 preventing the exterior member 11 from spreading out. The protective member 8 having such a configuration is provided as shown in FIGS. 1B to 1E and 2A. Specifically, in the individual wire shake range R3 in the shake tolerance range R1, the protective member 8 is provided so as to cover the high-voltage electric wires 4 while the high-voltage electric wires 4 can be individually shaken, namely, the protective member 8 is provided so as to cover the high-voltage electric wires 4 loosely. Further, in the wire bundle shake range R4, the protective member 8 tightly covers the high-voltage electric wires 4 which are in a bundle shape. Incidentally, for covering the high-voltage electric wires 4 tightly, to tightly or thickly winding the wound tape 12 is effective.

In an inner space 13 (see FIG. 1C) of the protective member 8 corresponding to the individual wire shake range R3, as shown in an arrow, the high-voltage electric wires 4 can be individually (freely) shaken.

The braided wire 10 is formed by braiding conductive extra fine element wires in a tubular shape. The high-voltage electric wires 4 are inserted into an inside of the braided wire 10 in a lump. The braided wire 10 is expanded in a radial direction in the individual wire shake range R3, and is closely abutted on the high-voltage electric wires 4 in the wire bundle shake range R4 (alternatively, when the exterior member 11 is provided, the braided wire 10 becomes closely abutted on the high-voltage electric wires 4). Alternatively, the braided wire 10 of which size is unnecessary to be expanded is used, and narrowed in the wire bundle shake range R4 so as to be closely abutted on the high-voltage electric wires 4. Incidentally, the braided wire 10 is not limited to the above, and may be formed by rolling a sheet of wires in a tubular shape.

The exterior member 11 is a member exerting protective function against outside. In this embodiment, an abrasion-resistant flexible sheet is used as the exterior member 11. The exterior member 11 is wrapped around an outside of the braided wire 10. For example, a twist tube can be used as the exterior member 11. A wound tape is provided at a specific position of the exterior member 11. A whole length of the exterior member 11 is a little shorter than the braided wire 10, and therefore, the braided wire 10 is exposed. A tape made of, for example, acetate cloth is wound around a boundary where the braided wire 10 is exposed to form an acetate tube (not shown).

Regarding the protective member 8, a metallic foil 14 (see FIG. 3B) may be used instead of the braided wire 10, and the exterior member 11 may be wrapped around an outside of the metallic foil 14. Further, when the high-voltage electric wires 4 are not the non-shielded electric wires but the shielded electric wires 4', the exterior member 11 may be directly wrapped around the high-voltage electric wires 4 without using the braided wire 10 and the metallic foil 14 (see FIG. 3C).

A length of the protective member 8 is long enough to extend between the motor-side connecting portion 6 and the inverter-side connecting portion 7 (see FIG. 1A).

The motor-side connecting portion 6 includes: a terminal (not shown) provided at each end of the high-voltage electric wires 4; an insulating housing (not shown) for individually receiving the terminal; and a ground portion (not shown) to be grounded at the motor 1 side; and a metallic shell (not shown) for connecting and fixing one end of the braided wire 10 to the ground portion. A publicly known structure is used as the motor-side connecting portion 6. (Because of the publicly known structure, a detailed explanation is omitted here.)

A configuration of the inverter-side connecting portion 7 is the same as the motor-side connecting portion 6. Namely, the inverter-side connecting portion 7 includes: a terminal (not shown) provided at each end of the high-voltage electric wires 4; an insulating housing (not shown) for individually receiving the terminal; and a ground portion (not shown) to be grounded at the inverter 2 side; and a metallic shell (not shown) for connecting and fixing the other end of the braided wire 10 to the ground portion. A publicly known structure is used as the inverter-side connecting portion 7. (Because of the publicly known structure, a detailed explanation is omitted here.)

The motor-side connecting portion 6 and the inverter-side connecting portion 7 are provided as a connecting portion of the wiring harness 3, and the configuration thereof is changed corresponding to a usage pattern (routing) of the wiring harness 3.

Next, a production of the wiring harness 3 will be explained based on the above configuration and the above structure.

In FIGS. 4A to 4C, in the wiring harness 3, the shake tolerance range R1 is set on the high-voltage electric wires 4, and the individual wire shake range R3 and the wire bundle shake range R4 are set on the shake tolerance range R1. As shown in FIG. 4A, in the individual wire shake range R3, for forming a condition in which the high-voltage electric wires 4 can be individually shaken, for example, a dummy electric wire 15 is firstly interposed between the high-voltage electric wires 4. (A simple bar may be used instead of the dummy electric wire 15. In this embodiment, the dummy electric wire 15 is provided for spacing the high-voltage electric wires 4. As long as the condition in which the high-voltage electric wires 4 can be individually shaken is formed, to interpose a simple bar is also effective.) In contrast, in the wire bundle shake range R4, the high-voltage electric wires 4 are abutted on each other.

Next, the braided wire 10 (see FIG. 3A) is inserted over the high-voltage electric wires 4 between which the dummy electric wire 15 is interposed (the high-voltage electric wires 4 may be inserted into the braided wire 10).

Next, the exterior member 11 is wrapped around the outside of the braided wire 10, and the wound tape 12 is wound at a desired position of the exterior member 11. The exterior member 11 is wrapped in a manner that in the individual wire shake range R3, the high-voltage electric wires 4 can be individually shaken, namely, in a loose state. Further, in the wire bundle shake range R4, the exterior member 11 is tightly attached to the high-voltage electric wires 4.

Next, as shown in FIGS. 4B and 4C, the dummy electric wire 15 is pulled out. After the dummy electric wire 15 is completely pulled out, the high-voltage electric wires 4 can be individually shaken.

Next, the motor-side connecting portion 6 and the inverter-side connecting portion 7 are provided at ends of the high-voltage electric wires 4. Further, the end of the braided wire 10 is connected and fixed to the ground portion, and the acetate tube (not shown) is formed. Thus, the production of the wiring harness 3 is finished.

Next, an effect of the wiring harness 3 will be explained based on the above configuration and the above structure.

In FIG. 1A, when the wiring harness 3 electrically connects the motor 1 and the inverter 2, and in this connecting state, the motor 1 is driven or a vehicle is running, a vibration or a shock from the motor 1 or an outside is propagated to the wiring harness 3. Thereby, a portion corresponding to the shake tolerance range R1 (in particular, the individual wire shake range R3) is shaken in the arrow direction. This shaking contributes to the absorption of the above vibration or the like. Therefore, when the above shaking is generated, the shaking force affected to the inverter-side connecting portion 7 is not applied.

As explained with reference to FIGS. 1A to 4C, according to the wiring harness 3 of the present invention, the vibration or the shock from the motor 1 or the like is positively propagated to the shake tolerance range R1 (the individual wire shake range R3 and the wire bundle shake range R4) set on the high-voltage electric wires 4 in the harness main body 5. Therefore, the vibration or the like can be absorbed. When the vibration or the like is absorbed as the wiring harness 3 of the present invention, the noise, the damage or the like can be also prevented. Further, according to the wiring harness 3 of the present invention, because the high-voltage electric wires 4 in the individual wire shake range R3 is routed so as to be individually shaken, the high-voltage electric wires 4 can be effectively shaken.

In addition, according to the wiring harness 3 of the present invention, because the total length of the high-voltage electric wires 4 in the wire bundle shake range R4 can be reduced, the routing flexibility is increased.

Of course, the present invention can be variously modified within a scope of the present invention.

REFERENCE SIGNS LIST

1 motor
2 inverter
3 wiring harness
4 high voltage electric wire
4' shielded wire
5 harness main body
5*a* middle portion
5*b* end portion
6 motor-side connecting portion
7 inverter-side connecting portion
8 protective member
9 ordered state maintaining member
10 braided wire (shielding member)
11 exterior member
12 wound tape
13 inner space
14 metallic foil
15 dummy electric wire
R1 shake tolerance range
R2 terminal forming range
R3 individual wire shake range
R4 wire bundle shake range

The invention claimed is:

1. An on-vehicle wiring harness comprising:
   a harness main body having a plurality of high-voltage electric wires, one end of the harness main body is connected to a device that is a generating source of a vibration included during travelling of vehicle,
   wherein the harness main body includes an end portion configured to be connected to the device and a middle portion continuous with the end portion,
   wherein the middle portion includes a shake tolerance range where the vibration induced during a drive of the device generating the vibration or an external physical shock can be propagated to the plurality of high-voltage electric wires so that the high-voltage electric wires can be shaken,
   wherein the range includes an individual wire shake range, and where the high-voltage electric wires are wired at predetermined intervals so that the high-voltage electric wires adjacent to each other are not closely abutted on each other,
   wherein in the individual wire shake range the high-voltage electric wires are wired so that the high-voltage electric wires each freely shake when the vibration or the external physical shock is propagated.

2. The wiring harness as claimed in claim 1, wherein a plurality of shielded electric wires are used as the high-voltage electric wires.

3. The wiring harness as claimed in claim 1,
   wherein a plurality of non-shielded electric wires are used as the high-voltage electric wires, and
   wherein the harness main body includes a shield member for covering the non-shielded electric wires in a lump.

4. The wiring harness as claimed in claim 1, wherein the harness main body includes a protect member covering the plurality of high-voltage electric wires while allowing the high-voltage electric wires to be shaken individually.

5. The wiring harness as claimed in claim 2, wherein the harness main body includes a protect member covering the plurality of high-voltage electric wires while allowing the high-voltage electric wires to be shaken individually.

6. The wiring harness as claimed in claim 3, wherein the harness main body includes a protect member covering the plurality of high-voltage electric wires while allowing the high-voltage electric wires to be shaken individually.

* * * * *